(12) United States Patent
Yoo et al.

(10) Patent No.: US 12,402,534 B2
(45) Date of Patent: Aug. 26, 2025

(54) METHOD OF FORMING AN ELECTRODE IN A CERAMIC TRANSDUCER ELECTRONIC COMPONENT

(71) Applicant: Korea Electronics Technology Institute, Seongnam-si (KR)

(72) Inventors: Myong Jae Yoo, Seoul (KR); Hyung Won Kang, Seoul (KR); Seung Ho Han, Gwacheon-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 962 days.

(21) Appl. No.: 17/468,404

(22) Filed: Sep. 7, 2021

(65) Prior Publication Data

US 2022/0077381 A1 Mar. 10, 2022

(30) Foreign Application Priority Data

Sep. 4, 2020 (KR) .................. 10-2020-0113263

(51) Int. Cl.
*H04R 17/00* (2006.01)
*H10N 30/06* (2023.01)
(Continued)

(52) U.S. Cl.
CPC .......... *H10N 30/082* (2023.02); *H10N 30/06* (2023.02); *H10N 30/097* (2023.02); *H10N 30/8554* (2023.02); *H10N 30/87* (2023.02)

(58) Field of Classification Search
CPC ...... H10N 30/06; H10N 30/08; H10N 30/082; H10N 30/087; H10N 30/097; H10N 30/8554
See application file for complete search history.

(56) References Cited

U.S. PATENT DOCUMENTS 8,698,377 B2 * 4/2014 Sinelnikov ............... A61N 7/02
310/326
10,537,255 B2 * 1/2020 Eberle ................. A61B 5/02154
(Continued)

FOREIGN PATENT DOCUMENTS

| KR | 10-2016-0148459 A | 12/2016 |
| KR | 10-2017-0127398 A | 11/2017 |
| KR | 10-1947231 B | 2/2019 |

OTHER PUBLICATIONS

Office Action in corresponding Korean Application No. 10-2020-0113263 dated Feb. 21, 2023.

*Primary Examiner* — Paul D Kim
(74) *Attorney, Agent, or Firm* — Knobbe, Martens, Olson & Bear, LLP

(57) ABSTRACT

A method of forming an electrode in a ceramic transducer electronic component is provided. The method includes preparing a sintered body for a ceramic transducer containing a metal oxide, performing patterning by irradiating a laser on a surface of the sintered body for a ceramic transducer, and forming a metal electrode by performing an electroless plating process on the sintered body for a ceramic transducer on which the patterning is formed, wherein, in the performing of the patterning by irradiating the laser on the surface of the sintered body for a ceramic transducer, the patterning is performed by irradiating the laser that satisfies at least one of a predetermined power condition and a predetermined processing speed condition.

4 Claims, 4 Drawing Sheets

(51) Int. Cl.
    *H10N 30/082*     (2023.01)
    *H10N 30/097*     (2023.01)
    *H10N 30/853*     (2023.01)
    *H10N 30/87*     (2023.01)

(56) References Cited

U.S. PATENT DOCUMENTS

2007/0087930 A1*   4/2007   Priya .................... H10N 30/306
                                                                                                         264/681
2016/0372255 A1*  12/2016   Maki ..................... H01F 41/041

\* cited by examiner

<Speed: 700mm/sec, Power: 15W>

<Speed: 2000mm/sec, Power: 20W>

<Speed: 700mm/sec, Power: 20W>

BEFORE PLATING

PLATING FOR 5 MINUTES

PLATING FOR 10 MINUTES

COPPER ELECTRODE PRODUCED UNDER CONDITION OF 500 MM/SEC

METHOD OF FORMING AN ELECTRODE IN A CERAMIC TRANSDUCER ELECTRONIC COMPONENT

CROSS REFERENCE TO RELATED APPLICATIONS

This application claims priority to and the benefit of Korean Patent Application No. 10-2020-0113263, filed on Sep. 4, 2020, the disclosure of which is incorporated herein by reference in its entirety.

BACKGROUND

1. Field

The present disclosure relates to a ceramic transducer electronic component and a method of forming an electrode therein.

2. Discussion of Related Art

In a method of forming electrodes in a ceramic component, a paste or ink is prepared from a silver material, and then the paste or ink is applied to a desired portion through a process such as printing and jetting, and the resultant product is heat-treated to form the electrodes. Alternatively, when a copper material is used, the electrodes are formed under a nitrogen atmosphere or an oxidation inhibiting atmosphere during heat treatment.

When electrodes are formed in a ceramic transducer electronic component using the related art, an expensive silver material should be used, or a special heat treatment process should be performed even when a copper material is used.

Korean Patent Application Publication No. 10-2017-0127398 (published on Nov. 21, 2017) discloses the related technology. The disclosure of this section is to provide background information relating to the present disclosure. Applicant does not admit that any information contained in this section constitutes prior art.

SUMMARY

The present disclosure relates to a ceramic transducer electronic component and a method of forming an electrode therein, and more particularly, to a method of forming a surface pattern on a ceramic material using an electromagnetic wave, especially a laser, and forming an electrode using an electroless plating process. An embodiment of the present disclosure is directed to providing a ceramic transducer electronic component and a method of forming an electrode therein, in which, when a metal electrode is formed on or over an electronic component for a ceramic transducer, optimal processing speed and power conditions of a laser, which are applied while patterning is performed on a surface of the electronic component, are set and a roughness value at a patterned portion is adjusted so that performance as a piezoelectric component is exhibited.

However, the technical problem to be solved by the present embodiment is not limited to the technical problem as described above, and other technical problems may exist.

According to an aspect of the present disclosure, there is provided a method of forming an electrode in a ceramic transducer electronic component, the method including preparing a sintered body for a ceramic transducer containing a metal oxide, irradiating a laser on a surface of the sintered body for a ceramic transducer to perform patterning, and performing an electroless plating process on or over the sintered body for a ceramic transducer, on which the patterning is formed, to form a metal electrode. In the irradiating of the laser on the surface of the sintered body for a ceramic transducer to perform the patterning, the laser that satisfies at least one of a predetermined power condition and a predetermined processing speed condition is irradiated to perform the patterning.

The sintered body for a ceramic transducer may be a sintered body for a ceramic transducer based on a PZT-PZN piezoelectric ceramic composition.

In the irradiating of the laser on the surface of the sintered body for a ceramic transducer to perform the patterning, the laser that satisfies a processing speed condition of 400 mm/sec or less as the predetermined processing speed condition may be irradiated to perform the patterning.

In the irradiating of the laser on the surface of the sintered body for a ceramic transducer to perform the patterning, a processing speed of the laser may be reduced in a range satisfying the predetermined processing speed condition so that an average roughness value of the patterned region is greater than or equal to two micrometers and less than five micrometers.

In the irradiating of the laser on the surface of the sintered body for a ceramic transducer to perform the patterning, the laser that satisfies a power condition of 10 watts or more as the predetermined power condition may be irradiated to perform the patterning.

In the irradiating of the laser on the surface of the sintered body for a ceramic transducer to perform the patterning, the laser that satisfies a wavelength condition of 1064 nm, a pulse width condition in a range of 20 to 200 ns, and a frequency condition in a range of 20 to 60 kHz may be irradiated to perform the patterning.

According to another aspect of the present disclosure, there is provided a ceramic transducer electronic component including a sintered body for a ceramic transducer containing a metal oxide, and a metal electrode region formed on a surface of the sintered body for a ceramic transducer on which metal plating is not conducted, wherein the metal electrode region is formed by performing an electroless plating process on patterning formed by irradiating a laser that satisfies at least one of a predetermined power condition and a predetermined processing speed condition.

In some embodiments of the present disclosure, the laser satisfying a processing speed condition of 400 mm/sec or less as the predetermined processing speed condition may be irradiated to perform the patterning.

As a processing speed of the laser is reduced in a range satisfying the predetermined processing speed condition, the patterned region may have an average roughness value of two micrometers or more and less than five micrometers.

The laser that satisfies a power condition of 10 watts or more as the predetermined power condition may be irradiated to perform the patterning.

BRIEF DESCRIPTION OF THE DRAWINGS

The above and other objects, features, and advantages of the present disclosure will become more apparent to those of ordinary skill in the art by describing embodiments thereof in detail with reference to the accompanying drawings, in which.

DETAILED DESCRIPTION OF EMBODIMENTS

Figure 1:
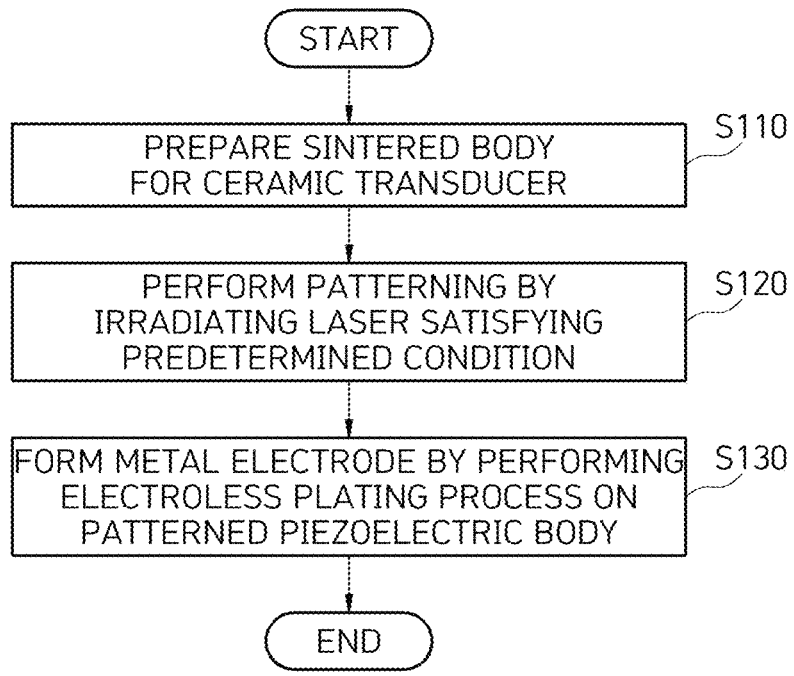
FIG. 1 is a flowchart of a method of forming an electrode in a ceramic transducer electronic component according to one embodiment of the present disclosure.

Hereinafter, embodiments of the present disclosure will be described in detail with reference to the accompanying drawings to allow those skilled in the art to easily execute the same. However, the present disclosure may be implemented in several different forms and is not limited to embodiments described herein. In addition, parts irrelevant to the description are omitted in the drawings in order to clearly explain the present disclosure. Similar parts are denoted by similar reference numerals throughout this specification.

Throughout this specification, when a part is referred to as being "connected" to another part, it includes "directly connected" and "electrically connected" via an intervening part.

Throughout this specification, when a member is referred to as being located "on" another member, it includes not only the case in which a member is in contact with another member but also the case in which still another member is present between the member and another member.

Throughout this specification, when a part is referred to as "including" a certain component, it includes "further including" another component without excluding another component unless otherwise stated. As used throughout this specification, the terms "about," "substantially," and the like, indicating the degree, are used at, or in the sense of, numerical values when manufacturing and material tolerances inherent in the meanings mentioned are provided and are used to prevent an unscrupulous invader from unfairly using the disclosure in which accurate or absolute figures are mentioned to aid the understanding of the present disclosure. As used throughout this specification, the terms "operation to" or "operation of" does not mean "operation for."

In an example method, a technique using a laser may be proposed as a method of simply forming electrodes on a ceramic material, but adhesion of the electrodes and a specific effect on a ceramic transducer electronic component are not specified.

In the case of the ceramic transducer electronic component, particularly a ceramic piezoelectric body, the performance as a piezoelectric component may be exhibited only when a polling process is performed using the formed electrodes, and thus it is very important to exhibit surface adhesion to the formed electrodes, and piezoelectric performance after the polling process using the formed electrodes.

Hereinafter, a method of forming an electrode in a ceramic transducer electronic component according to one embodiment of the present disclosure will be described with reference to FIGS. 1 to 4.

FIG. 1 is a flowchart of a method of forming an electrode in a ceramic transducer electronic component according to one embodiment of the present disclosure.

The ceramic transducer electronic component in one embodiment of the present disclosure includes a sintered body for a ceramic transducer, which contains a metal oxide, and a metal electrode region formed on a surface of the sintered body for a ceramic transducer, on which metal plating is not conducted.

To this end, first, the sintered body for a ceramic transducer containing a metal oxide is prepared (S110).

In one embodiment, the sintered body for a ceramic transducer may be a sintered body for a ceramic transducer based on a PZT-PZN piezoelectric ceramic composition. That is, in one embodiment of the present disclosure, a metal electrode is formed on a piezoelectric body using the PZT-PZN piezoelectric ceramic composition.

Next, patterning is performed by irradiating a laser on the surface of the sintered body for a ceramic transducer (S120).

Here, in one embodiment of the present disclosure, the patterning is performed by irradiating a laser that satisfies at least one of a predetermined power condition and a predetermined processing speed condition for the laser.

In this case, in one embodiment of the present disclosure, as a wavelength condition, a pulse width condition, and a frequency condition other than the predetermined power and processing speed conditions for the laser, a wavelength condition of 1064 nm, a pulse width condition in a range of 20 to 200 ns, and a frequency condition in a range of 20 to 60 kHz are applied, but the present disclosure is not limited thereto.

Figure 2A:
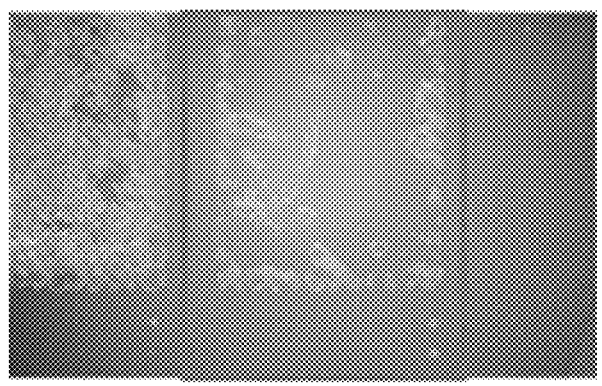
FIG. 2A to FIG. 2C are view illustrating an example of patterning performed by irradiating a laser under a power condition and a processing speed condition.
Figure 2B:
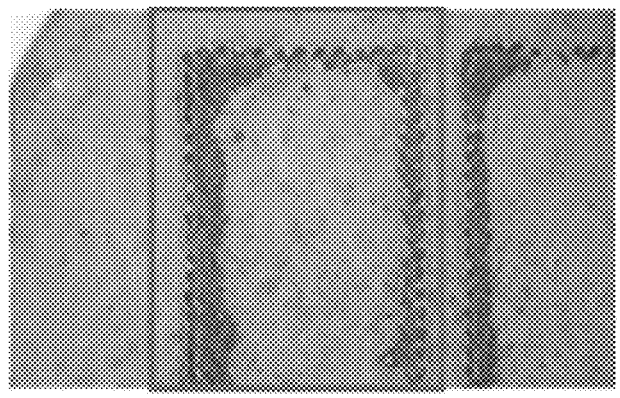
Figure 2C:
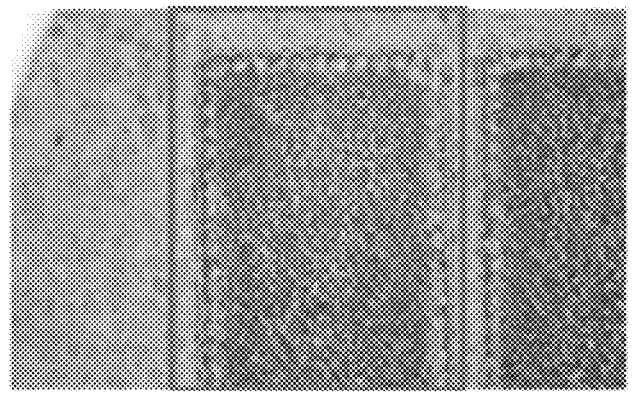

FIG. 2A to FIG. 2C are view illustrating an example of the patterning performed by irradiating a laser under the power and processing speed conditions.

Surface patterning may be performed by irradiating a laser on a piezoelectric sintered body (hereinafter, referred to as a piezoelectric body) for a ceramic transducer. In this case, different patterning results may be obtained depending on laser power and processing speed conditions.

For example, in a case in which a processing speed is too fast, as shown in FIG. 2B, or a laser power is weak, as shown in FIG. 2A, patterning is not uniform across the piezoelectric body.

Thus, in order to uniformly pattern the surface of the piezoelectric body, the power and speed conditions of the laser need to be properly combined. In this case, the combination of the power and speed conditions of the laser may vary depending on the composition condition of the piezoelectric body.

TABLE 1

| Speed (mm/sec) | Roughness (μm) | | | |
| --- | --- | --- | --- | --- |
| | A | B | C | D |
| 100 | 4.51 | 3.91 | 3.85 | 4.41 |
| 300 | 2.02 | 1.90 | 2.33 | 1.49 |
| 500 | 1.96 | 1.43 | 1.39 | 1.43 |

Table 1 illustrates average roughness values, at which uniform patterning is achieved, obtained by fixing the laser power to 17.5 watts and changing the processing speed for various PZT-PZN piezoelectric ceramic compositions A, B, C, and D.

As an example, it can be confirmed that the average roughness value at a patterned portion, which is formed when the laser processing speed is 500 mm/sec, is in a range of 1.39 to 1.96 micrometers. When the patterning having the average roughness value in the above range is used, the adhesion of the electrode is low.

Further, as shown in Table 1, when the processing speed of the laser is gradually reduced, the formed roughness has a greater value.

Based on this point, in one embodiment of the present disclosure, a processing speed condition of 400 mm/sec or less may be applied as the predetermined processing speed condition in which the laser is irradiated. That is, the patterning may be performed by irradiating a laser satisfying the processing speed condition of 400 mm/sec or less.

In the range satisfying such a predetermined processing speed condition, the processing speed of the laser may be reduced so that the average roughness value of the patterned region is greater than or equal to two micrometers or less than five micrometers.

At this point, when the average roughness value of the patterned region is less than two micrometers, the adhesion of the electrode is low, and thus the processing speed condition of the laser may be reduced so that the patterned region has an average roughness value of two micrometers or more.

In addition, when the average roughness value of the patterned region is greater than or equal to five micrometers, a shape of the electrode is not well-formed because a smearing phenomenon occurs in plating, and thus the processing speed condition of the laser may be reduced within a range in which the average roughness value of the patterned region is less than five micrometers.

In addition, according to one embodiment of the present disclosure, a power condition of 10 watts or more may be applied as the predetermined power condition for the laser. That is, since patterning is not uniformly performed on the piezoelectric body at an output of less than 10 watts, a power condition of 10 watts or more may be satisfied, and thus the patterning may be performed by irradiating a laser having a power condition of 15 watts or more.

Referring to FIG. 1 again, a metal electrode is formed by performing an electroless plating process on the piezoelectric body on which the patterning is formed (S130).

Figure 3A:
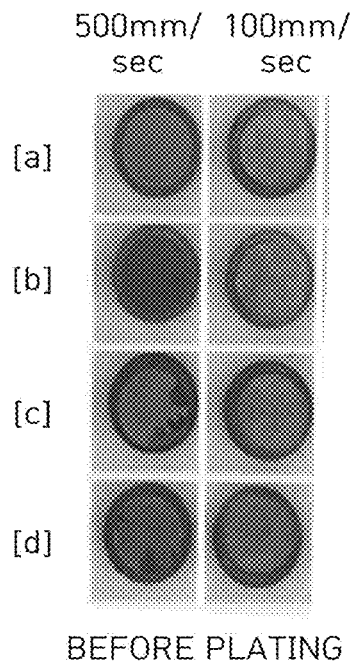
FIG. 3A to FIG. 3C are view illustrating an example of an electroless plating process performed according to one embodiment of the present disclosure.
Figure 3B:
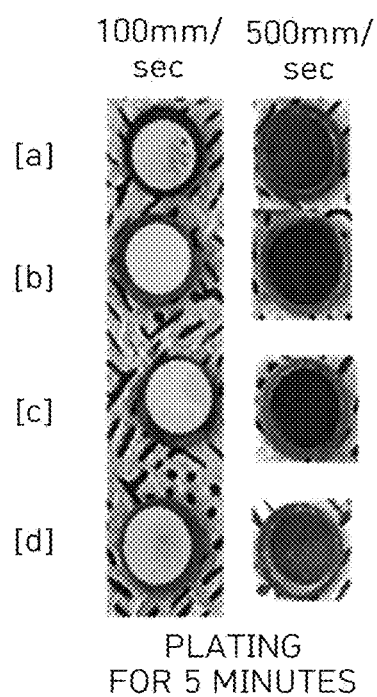
Figure 3C:
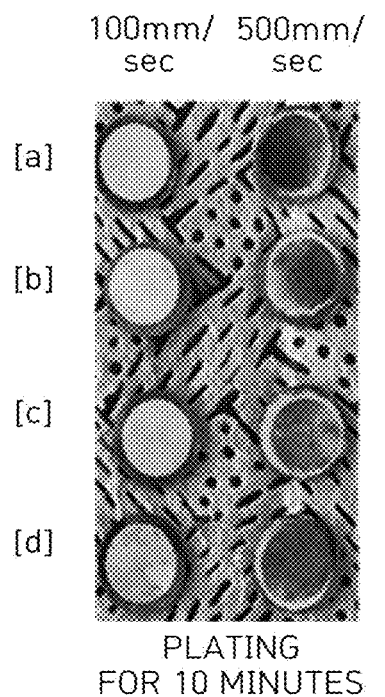

FIG. 3A to FIG. 3C are view illustrating an example of the electroless plating process performed according to one embodiment of the present disclosure.

FIG. 3 illustrates copper electrodes formed by performing the electroless plating process on the patterned regions that are formed according to the processing speed conditions of 500 mm/sec and 100 mm/sec in Table 1.

As shown in FIG. 3, in embodiments, the electroless plating process may be performed for more than 5 minutes in order to confirm that the copper electrode is well formed. At this point, since the patterning formed under the processing speed condition of 100 mm/sec has a higher roughness value than that formed under the processing speed condition of 500 mm/sec, when the roughness value is high, a relatively longer time period is required to implement a uniform copper plating film.

Figure 4:
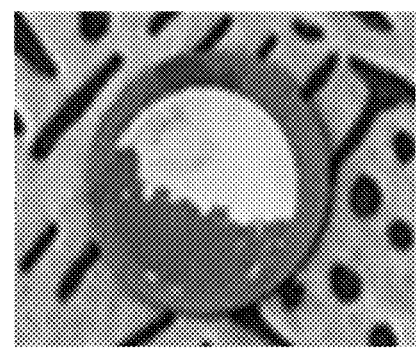
FIG. 4 is a view illustrating a test result of an adhesion of an electrode produced under a processing speed condition of 500 mm/sec.

FIG. 4 is a view illustrating a test result of the adhesion of the electrode produced under the processing speed condition of 500 mm/sec.

After the copper electrode is formed by the electroless plating process, the adhesion of the corresponding electrode may be evaluated by a tape adhesion test. Here, the average roughness value of the patterned portion formed under the processing speed condition of 500 mm/sec has a value of less than two micrometers, and in this case, the adhesion of the electrode is lowered.

It can be confirmed that 50% or more of the copper electrode is torn off as a result of performing the tape adhesion test on the copper electrode produced as described above.

Table 2 illustrates piezoelectric performance of piezoelectric bodies, each of which includes a metal electrode region, produced according to one embodiment of the present disclosure.

TABLE 2

| | PZT-PZN | Novel electrodes (Present disclosure) | Silver electrodes |
|---|---|---|---|
| $d_{33}$(pC/N) | A | 267 | 264 |
| | B | 289 | 288 |
| | C | 323 | 321 |
| | D | 417 | 411 |
| $k_p$ (%) | A | 56 | 57 |
| | B | 52 | 51 |
| | C | 57 | 55 |
| | D | 60 | 61 |

A general polling process (condition of applying two to three kV/mm) was performed on electrodes produced by patterning PZT-PZN piezoelectric ceramic compositions according to the above-described conditions of laser and performing an electroless plating process, and it can be confirmed that almost the same characteristics as the electrode produced using the typical silver material are realized as a result of measuring a piezoelectric constant and a coupling coefficient after the polling process.

Meanwhile, in the above descriptions, operations S110 to S130 may be further divided into additional operations or combined into fewer operations, according to embodiments of the present disclosure. In addition, some operations may be omitted if necessary, and the order between operations may be changed.

According to the present disclosure as described above, in a ceramic transducer component, costs can be reduced, and simultaneously, an electrode with excellent adhesion can be formed. In particular, it can be expected that a metal electrode produced according to the embodiment of the present disclosure has the same piezoelectric performance as the case of using a silver electrode even after a polling process is performed.

Effects of the present disclosure will not be limited to the above-described effects and other unmentioned effects will be clearly understood by those of ordinary skill in the art from the following claims.

The above description is only an example, and it will be understood by those skilled in the art that the disclosure may be performed in other concrete forms without changing the technological scope and essential features. Accordingly, the above-described embodiments should be considered only as examples in all aspects and not for purposes of limitation. For example, each component described as a single type may be implemented in a distributed manner, and similarly, components that are described as being distributed may be implemented in a coupled manner.

The scope of the present disclosure is defined not by the detailed description but by the appended claims and encompasses all modifications or alterations derived from meanings, the scope and equivalents of the appended claims.

What is claimed is:

1. A method of forming an electrode in a ceramic transducer electronic component, the method comprising;
    preparing a sintered body for a ceramic transducer containing a PZT-PZN piezoelectric ceramic composition;
    irradiating a laser on a surface of the sintered body for the ceramic transducer to perform patterning and form a patterned surface; and performing an electroless plating process on the patterned surface of the sintered body using copper for more than 5 minutes to form a copper electrode, wherein, in irradiating the laser on the surface of the sintered body to perform the patterning, the laser has a pulse width in a range of 20 ns to 200 ns, an irradiation frequency in a range of 20 kHz to 60 kHz, an irradiation power equal to or greater than 10 watts, and a processing speed equal to or less than 400 mm/sec such that the patterned surface has an average roughness value equal to or greater than 2 micrometers and smaller than 5 micrometers.

2. The method of claim 1, wherein the irradiation power of the laser is equal to or greater than 15 watts.

3. The method of claim 1, wherein the irradiation power of the laser is 17.5 watts.

4. The method of claim 1, wherein the processing speed of the laser is 300 mm/sec.

\* \* \* \* \*